(12) United States Patent
Sun et al.

(10) Patent No.: US 10,014,219 B2
(45) Date of Patent: Jul. 3, 2018

(54) SEMICONDUCTOR DEVICE

(71) Applicant: SAMSUNG ELECTRONICS CO., LTD., Suwon-si, Gyeonggi-do (KR)

(72) Inventors: Min-Chul Sun, Seoul (KR); Byung-Gook Park, Hwasung (KR)

(73) Assignees: Samsung Electronics Co., Ltd., Suwon-Si, Gyeonggi-do (KR); Seoul National University R & DB Foundation, Seoul (KR)

( * ) Notice: Subject to any disclaimer, the term of this patent is extended or adjusted under 35 U.S.C. 154(b) by 0 days.

(21) Appl. No.: 15/441,594

(22) Filed: Feb. 24, 2017

(65) Prior Publication Data

US 2017/0162442 A1 Jun. 8, 2017

Related U.S. Application Data

(62) Division of application No. 14/969,025, filed on Dec. 15, 2015, now Pat. No. 9,583,583, which is a division
(Continued)

(30) Foreign Application Priority Data

Oct. 10, 2012 (KR) .......................... 10-2012-0112510

(51) Int. Cl.
*H01L 29/423* (2006.01)
*H01L 21/8234* (2006.01)
*H01L 29/06* (2006.01)
*H01L 29/786* (2006.01)
*H01L 29/78* (2006.01)
*H01L 27/088* (2006.01)
(Continued)

(52) U.S. Cl.
CPC ............... *H01L 21/823412* (2013.01); *H01L 21/02532* (2013.01); *H01L 21/02647* (2013.01); *H01L 21/3065* (2013.01); *H01L 27/088* (2013.01); *H01L 29/0673* (2013.01); *H01L 29/42392* (2013.01); *H01L 29/7843* (2013.01); *H01L 29/78651* (2013.01); *H01L 29/78696* (2013.01)

(58) Field of Classification Search
CPC ......... H01L 21/823412; H01L 29/0673; H01L 29/42392; H01L 29/78696; H01L 29/78651
See application file for complete search history.

(56) References Cited

U.S. PATENT DOCUMENTS 5,629,638 A * 5/1997 Kumar .................. G06F 17/505
  326/121
7,374,986 B2 5/2008 Kim et al.
(Continued)

FOREIGN PATENT DOCUMENTS

JP 2011-029503 2/2011
KR 10-2007-0068725 A 7/2007
WO WO 2012/066444 A1 5/2012

*Primary Examiner* — Dung Le
(74) *Attorney, Agent, or Firm* — Lee & Morse, P.C.

(57) ABSTRACT

A semiconductor device includes a structure on a substrate and a plurality of gate-all-around devices on the structure. The structure includes a plurality of sacrificial layers and a plurality of active layers alternately stacked on one another. The sacrificial layers have different widths and the active layers have different widths to form multiple stepped layers on the substrate. The gate-all-around devices are on respective ones the multiple stepped layers.

4 Claims, 17 Drawing Sheets

Related U.S. Application Data of application No. 14/048,347, filed on Oct. 8, 2013, now Pat. No. 9,219,119.

(51) Int. Cl.
  *H01L 21/02* (2006.01)
  *H01L 21/3065* (2006.01)

(56) References Cited

U.S. PATENT DOCUMENTS

| | | |
|---|---|---|
| 7,608,877 B2 | 10/2009 | Shioya et al. |
| 8,183,104 B2 * | 5/2012 | Hobbs ............... B82Y 10/00 257/E29.245 |
| 8,536,029 B1 * | 9/2013 | Chang ............... H01L 21/845 257/29 |
| 2010/0295022 A1 | 11/2010 | Chang et al. |
| 2011/0133167 A1 | 6/2011 | Bangsaruntip et al. |
| 2011/0254101 A1 | 10/2011 | Xiao et al. |
| 2011/0254102 A1 | 10/2011 | Xiao et al. |
| 2011/0278543 A1 | 11/2011 | Bangsaruntip et al. |
| 2011/0278544 A1 | 11/2011 | Bangsaruntip et al. |
| 2012/0007052 A1 | 1/2012 | Hobbs et al. |
| 2013/0207079 A1 | 8/2013 | Sleight et al. |

* cited by examiner

2

9

SEMICONDUCTOR DEVICE

CROSS-REFERENCE TO RELATED APPLICATIONS

This is a divisional application based on pending application Ser. No. 14/969,025, filed Dec. 15, 2015, which in turn is a division of Ser. No. 14/048,347, filed Oct. 8, 2013, now U.S. Pat. No. 9,219,119 B2 issued Dec. 22, 2015, the entire contents of which is hereby incorporated by reference.

Korean Patent Application No. 10-2012-0112510, filed on Oct. 10, 2012, and entitled: "Semiconductor Device and Fabricating Method Thereof," is incorporated by reference herein in its entirety.

BACKGROUND

1. Field

One or more embodiments described herein relate to a semiconductor device.

2. Description of the Related Art

Attempts have been made to increase the density of a semiconductor device using scaling techniques. One scaling technique involves forming a gate-all-around structure, in which a gate is formed to surround a nanowire on a substrate. Because gate-all-around structures use a three-dimensional channel, scaling can be readily performed and current control can be improved without increasing the length of the gate. Further, a short channel effect (SCE), in which a potential of a channel region is affected by a drain voltage, can be effectively suppressed.

SUMMARY

Embodiments are directed to a semiconductor device having different threshold voltages, reduced parasitic capacitance, and/or stress structures, and method for making the same.

In accordance with one embodiment, a semiconductor device includes a substrate including a first region and a second region separated from each other, a structure on the substrate, the structure having at least one sacrificial layer and at least one active layer, a first gate-all-around device including a first nanowire in the first region, and a second gate-all-around device including a second nanowire in the second region. The first nanowire may be at substantially a same level as an active layer in the second region, and the second nanowire may be at a level different from the level of the first nanowire. A threshold voltage of the first gate-all-around device may be based on a thickness of the active layer in the second region.

Also, a first threshold voltage of the first gate-all-around device may be different from a second threshold voltage of the second gate-all-around device, and the second nanowire may be on the active layer in the second region.

Also, the first nanowire may be on an active layer in the first region, the second nanowire may be on the active layer in the second region, and the active layer in the second region may be higher than the active layer in the first region. The second region may not include a nanowire on a level of an active layer in the first region.

Also, a thickness of the active layer in the first region may be different from a thickness of the active layer in the second region. A thickness of the first nanowire may be substantially equal to a thickness of the active layer in the second region, and/or a thickness of the first nanowire is different from a thickness of the second nanowire.

Also, a first gate of the first gate-all-around device and a second gate of the second gate-all-around device are separated from each other. Source/drain areas of the first gate-all-around device may be raised or embedded source/drain areas. The active layer may include Si and the sacrificial layer includes SiGe.

Also, the substrate may include a third region, a third gate-all-around device including a third nanowire may be in the third region, and the third nanowire may be on an active layer in the third region that is at a different level from the active layer in the second region. Active layers in the first, second, and third active regions may have different widths and may be stacked on the substrate. At least one active layer in one of the first, second, or third regions may not be included in another one of the first, second, or third regions.

Also, the second region may have another nanowire adjacent the second nanowire, and a gate of the second gate-all-around device may apply a same signal to the second nanowire and the another nanowire in the second region. Also, a stress layer may be included on the first gate-all-around device.

In accordance with another embodiment, a semiconductor device includes a structure having a first sacrificial layer, a first active layer, a second sacrificial layer and a second active layer sequentially formed on a substrate. A first width of the first active layer may be greater than a second width of the second active layer, so that the first active layer protrudes toward one side relative to the second active layer. A first gate-all-around device may be on the protruding part of the first active layer and may include a first nanowire. A thickness of the first nanowire may be substantially equal to a thickness of the second active layer.

Also, a second gate-all-around device may be located on the second active layer and may include a second nanowire. A first threshold voltage of the first gate-all-around device may be different from a second threshold voltage of the second gate-all-around device. A first thickness of the first nanowire may be different from a second thickness of the second nanowire.

Also, a first gate of the first gate-all-around device is separated from a second gate of the second gate-all-around device. The active layer may include Si and the sacrificial layer includes SiGe. Also, source/drain areas of the first gate-all-around device may be raised source/drain areas.

In accordance with another embodiment, a semiconductor device includes a structure on a substrate, the structure including a plurality of sacrificial layers and a plurality of active layers alternately stacked on one another, the sacrificial layers having different widths and the active layers having different widths to as to form multiple stepped layers on the substrate; and a plurality of gate-all-around devices on the structure, wherein the plurality of gate-all-around devices are disposed on respective ones the multiple stepped layers. The plurality of gate-all-around devices may have a plurality of nanowires of different thicknesses, and each of the plurality gate-all around devices may have a different threshold voltage.

In accordance with anther embodiment, a semiconductor device includes a sacrificial layer on a substrate; an active layer on the sacrificial layer; an insulation layer on the active layer; a nanowire on the insulation layer; and a gate on the insulation layer to surround the nanowire, wherein the nanowire and the active layer have different widths and different thicknesses.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
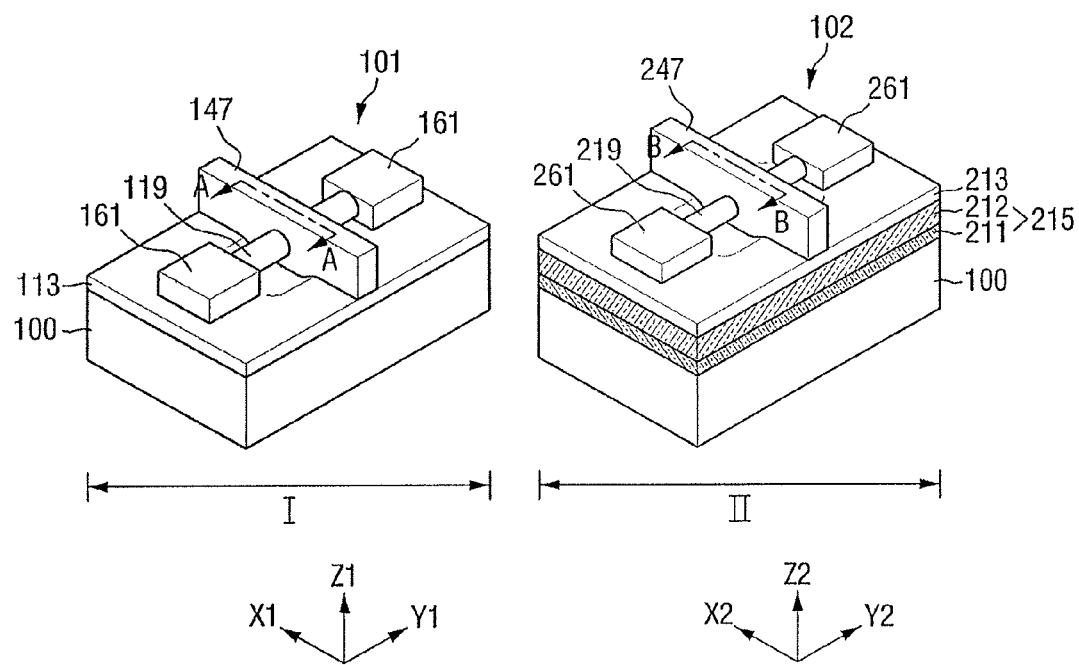
FIG. 1 illustrates a first embodiment of a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. Thus, in some embodiments, well-known methods, procedures, components, and circuitry have not been described in detail to avoid unnecessarily obscuring aspects of the present description.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, components, regions, layers and/or sections, these elements, components, regions, layers and/or sections should not be limited by these terms. These teams are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In accordance with one or more embodiments, a semiconductor device implements multiple threshold voltage (multi Vt) options, which operations may be used, for example, for power control and/or to achieve other performance objectives.

Figure 2:
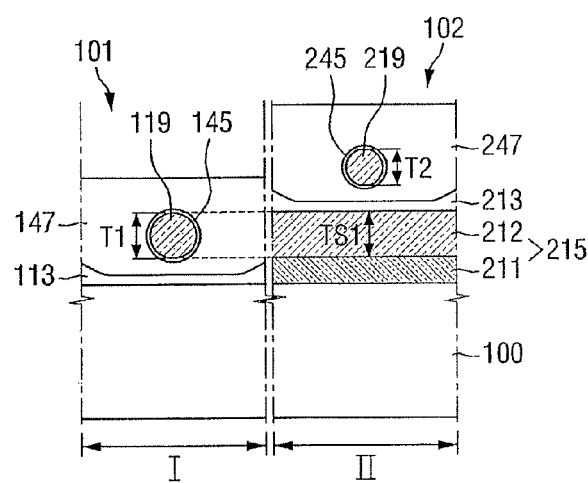
FIG. 2 illustrates cross-sectional views taken along lines A-A and B-B of FIG. 1.

FIG. 1 shows a first embodiment of a semiconductor device, and FIG. 2 show cross-sectional views of this device taken along lines A-A and B-B. As shown in these figures, a semiconductor device 1 includes a substrate 100, a structure 215, a first gate-all-around device 101, and a second gate-all-around device 102.

The substrate 100 may include a first region I and a second region II separated from each other. The substrate 100 may be made of, for example, one or more semiconductor materials selected from the group consisting of Si, Ge, SiGe, GaP, GaAs, SiC, SiGeC, InAs and InP. In addition, the substrate 100 may be bulk silicon or silicon-on-insulator (SOI). Alternatively, the substrate 100 may be a substrate having an epitaxial layer formed on a base substrate.

The first region I and the second region II may be horizontally separated from each other, i.e., the first region I and the second region II are not vertically separated from each other (e.g., not stacked one on the other.).

The structure 215 is formed on the substrate 100 and may include one or more sacrificial layers 211 and one or more active layers 212 alternately stacked one on another. That is, the one or more sacrificial layers 211 and the one or more active layers 212 may be stacked in a third direction Z1. In FIG. 1, a single sacrificial layer 211 and a single active layer 212 is shown for illustrative purposes. However, in other embodiments, a plurality of alternating sacrificial and active layers may be included on the substrate. In accordance with one embodiment, structure 215 may be used to form nanowires of the gate-all-around devices 101 and 102.

In accordance with one embodiment, the structure 215 may have a stepped shape. A first layer of the structure 215 may be formed in the first region I, and a second layer of the structure 215 may be formed in the second region II. The stepped shape may include a stack in which the sacrificial layer 211 and the active layer 212 are alternately stacked.

The active layer 212 may be made of, for example, one or more semiconductor materials selected from the group consisting of Si, Ge, SiGe, GaP, GaAs, SiC, SiGeC, InAs, and InP. In addition, the sacrificial layer 211 may be made of a different material from the active layer 212. In addition, the sacrificial layer 211 may have higher etching selectivity than the active layer 212. For example, the active layer 212 may include Si and the sacrificial layer 211 may include SiGe, but aspects of the present embodiments are not limited thereto.

The active layer 212/sacrificial layer 211 may be, for example, at least one selected from the group consisting of Ge/GaAs, Ge/InGaAs, Ge/GeSn, GeSn/III-V, AlGaAs/GaAs, AlGaAs/InGaP, GaN/InN, and AlN/InN. In addition, when the active layer 212 is formed by an epitaxial lateral overgrowth (ELO) method, the sacrificial layer 211 may be an insulation layer made of, for example, $SiO_2$, SiON, or SiN.

An insulation layer 113 may be formed on the first region I, and an insulation layer 213 may be formed on the second region II. The insulation layers 113 and 213 may be made of at least one of oxide, nitride, oxynitride, and a high-k material. For example, the high-k material may include $HfO_2$, $ZrO_2$ and $Ta_2O_5$.

The first gate-all-around device 101 may be formed on the first region I. The first gate-all-around device 101 may include first source/drain areas 161, a first nanowire 119 connected between the first source/drain areas 161, a first gate insulation layer 145 formed to surround the first nanowire 119, and a first gate 147. The first nanowire 119 may be formed, for example, to extend in a second direction Y1 and the first gate 147 may be formed to extend in a first direction X1. Also, as shown, the first nanowire 119 have a circular cross-sectional shape, but nanowire 119 may have a different shape in other embodiments. For example, the first nanowire 119 may have an oval, rectangular, or square cross-sectional shape.

The second gate-all-around device 102 may be formed on the second region II and is stacked on the structure 215. The second gate-all-around device 102 includes a second source/drain areas 261, a second nanowire 219 connected between the second source/drain areas 261, a second gate insulation layer 245 formed to surround the second nanowire 219, and a second gate 247. The second nanowire 219 may be formed to extend, for example, in the second direction Y2 and the second gate 247 may be formed to extend in the first direction X1. The second nanowire 219 may have the same shape as nanowire 119 or a different shape. For example, the nanowire 219 may have a circular, oval, rectangular, or square cross-sectional shape.

The first gate-all-around device 101 and the second gate-all-around device 102 may have various shapes and/or may form various types of devices. In one embodiment, the first and second gate-all-around devices 101 and 102 may form the same type of device, while in other embodiments devices 101 and 102 may form different types of devices. For example, the first gate-all-around device 101 and the second gate-all-around device 102 may be MOSFETs, junction-less MOSFETs, tunnel FETs, or field effect transistors, or may have a different type of transistor structure.

In accordance with the first embodiment, the second gate-all-around device 102 may be formed at a different level from the first gate-all-around device 101. For example, as shown, the second gate-all-around device 102 may be positioned higher than the first gate-all-around device 101. As a result, the first nanowire 119 and the second nanowire 219 may be formed at different levels. In other embodiments, the opposite may be true, i.e., second gate-all-around device 102 may be positioned lower than the first gate-all-around device.

In at least one embodiment, the first nanowire 119 may be formed at substantially a same level with the active layer 212. As described in greater detail below, the first nanowire 119 may be formed by patterning the active layer 212. Therefore, a thickness T1 of the first nanowire 119 may be substantially the same as a thickness TS1 of the active layer 212. If the first nanowire 119 has a circular cross-sectional shape, the thickness T1 of the first nanowire 119 may correspond to a diameter of a circle. In addition, the second nanowire 219 may be formed at substantially a same level as another active layer in either Region I or Region II, or another adjacent region, not shown herein.

The thickness T1 of the first nanowire 119 may be the same or different from a thickness T2 of the second nanowire 219. For example, as shown in FIG. 2, the thickness T1 of the first nanowire 119 may be greater than the thickness T2 of the second nanowire 219. Also, the thickness T2 of the second nanowire 219 may be the same or different from the thickness TS1 of the active layer 212. Also, a first threshold voltage of the first gate-all-around device 101 may be the same or different from a second threshold voltage of the second gate-all-around device 102. For example, the first gate all around device 101 may be a low threshold voltage (Low Vt) transistor, and the second gate all around device 102 may be a regular threshold voltage (Regular Vt) transistor. However, the opposite may be true in other embodiments. Also, the threshold voltages of devices 101 and 102 may different especially in the case where second nanowire 219 is different from the thickness TS1 of the active layer 212.

As described in greater detail below, in the case where the first nanowire 119 is formed using the active layer 212, the thickness T1 of the first nanowire 119 may be adjusted by adjusting the thickness TS1 of the active layer 212. That is, the first threshold voltage of the first gate-all-around device 101 can be adjusted by adjusting the thickness TS1 of the active layer 212.

The shape of the second gate-all-around device 102 formed on the second region II will now be described. The second gate-all-around device 102 includes the sacrificial layer 211, the active layer 212, the insulation layer 213, the second nanowire 219 formed on the insulation layer 213, and the second gate 247 formed on the insulation layer 213 so as to surround the second nanowire 219, which are sequentially formed on the substrate. A width of the active layer 212 may be greater than a width of the second nanowire 219, as shown in FIG. 2. In this case, the thickness TS1 of the active layer 212 and the thickness T2 of the second nanowire 219 are different from each other. In other embodiments, T2 and TS1 may be the same. Also, the width of active layer 212 may be the same or less than the width of the second nanowire 219 in some embodiments.

If a nanowire were formed on the second region II at the same level as the first nanowire 119, an unnecessary parasitic capacitor may be formed between the second nanowire 219 and another nanowire. To prevent a parasitic capacitance from forming, in accordance with at least one embodiment, a nanowire is not formed in the second region II at the same level as the first nanowire 119. In other words, the sacrificial layer 211 and the active layer 212 may be stacked on the second region II to be positioned below the second nanowire 219. Therefore, the semiconductor device 1 according to the first embodiment may thereby reduce or minimize formation of the unnecessary parasitic capacitances.

In addition, the first gate 147 of the first gate-all-around device 101 and the second gate 247 of the second gate-all-around device 102 may be physically and electrically separated from each other in at least one embodiment.

In addition, in at least one embodiment, the first source/drain areas 161 or the second source/drain areas 261 may be formed to be raised source/drain areas. In fabricating the first gate-all-around device 101 and the second gate-all-around device 102, underlying layers of the first gate-all-around device 101 and the second gate-all-around device 102 may be completely removed, thereby forming raised source/drain areas using, for example, an epitaxial method. In other embodiments, the source/drain areas 161 may be embedded source/drain areas, e.g., embedded in one or more insulating layers.

Figure 3:
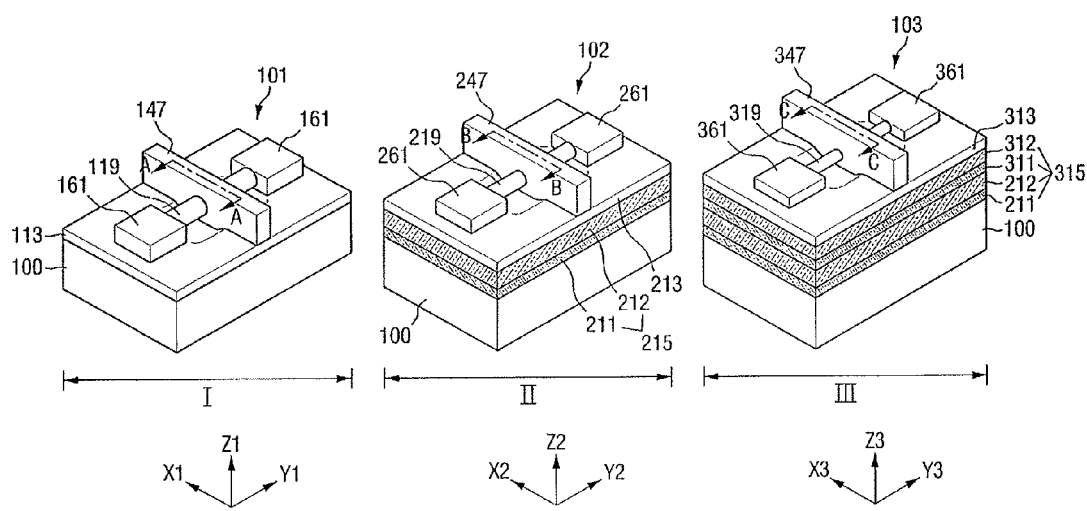
FIG. 3 illustrates a second embodiment of a semiconductor device.
Figure 4:
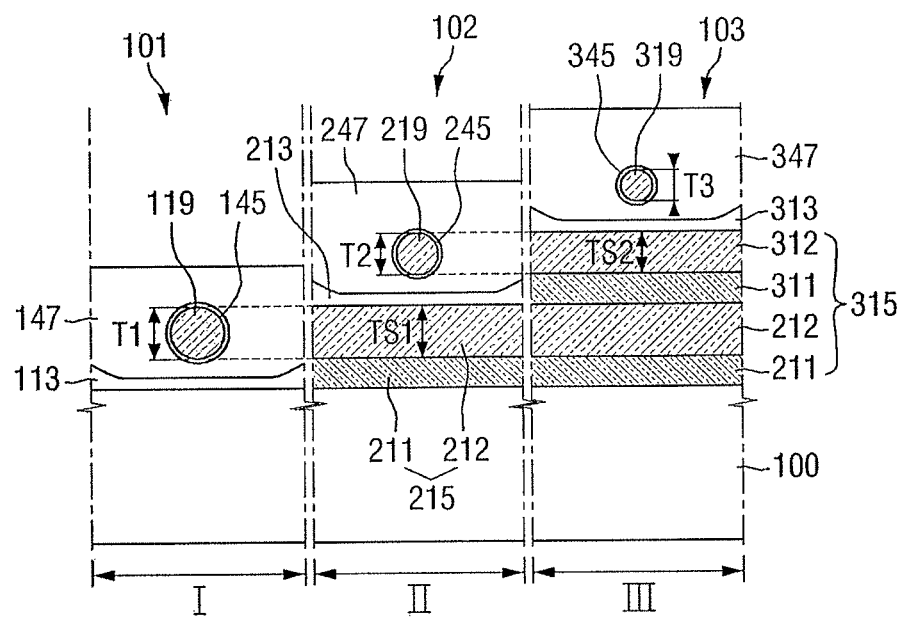
FIG. 4 illustrates cross-sectional views taken along lines A-A, B-B and C-C of FIG. 3.

FIG. 3 shows a second embodiment of a semiconductor device, and FIG. 4 shows cross-sectional views taken along lines A-A, B-B, and C-C of FIG. 3. For the sake of convenient explanation, the following description will focus on differences between the current embodiment and the previous embodiment shown in FIGS. 1 and 2.

Referring to FIGS. 3 and 4, in the semiconductor device 2 of the second embodiment, a substrate 100 may include a first region I, a second region II and a third region III. A first gate-all-around device 101 is formed in the first region I, a second gate all around device 102 is formed in the second region II, and a third gate all around device 103 is formed in the third region III.

Like in the previous embodiment, structures 215 and 315 may be configured such that one or more sacrificial layers 211 and 311 and one or more active layers 212 and 312 are alternately stacked one on another. The structures 215 and 315 the structure 215 may have a stepped shape. A first layer of each of the structures 215 and 315 may be formed in the first region I, a second layer of each of the structures 215 and 315 may be formed in the second region IL and a third layer of each of the structures 215 and 315 may be formed in the third region III.

In other words, the structures 215 and 315 include a sacrificial layer 211 and an active layer 212 sequentially stacked one on the other, and a sacrificial layer 311 and an active layer 312 sequentially stacked one on the other, respectively. A width of the active layer 212 may be greater than a width of the active layer 312, so that the active layer 212 protrudes toward one side relative to the active layer 312. That is, the active layer 312 may be formed in only the third region III, and the active layer 212 may be formed in the second region II and the third region III.

The third gate-all-around device 103 is formed in the third region III. The third gate-all-around device 103 includes third source/drain areas 361, a third nanowire 319 connected between the third source/drain areas 361, a third gate insulation layer 345 formed to surround the third nanowire 319, and a third gate 347. The third nanowire 319 may be formed, for example, to extend in a second direction Y1, the first gate 147 may be formed to extend in a second direction Y3, and the third gate 347 may be formed to extend in a first direction X3. In the illustrated embodiment, the third nanowire 319 has a circular cross-sectional shape. However, in other embodiments, the third nanowire 319 may have another shape such as, for example, an oval, rectangular or square cross-sectional shape. Also, the first, second, and third nanowires may have the same or different shapes.

In the semiconductor device 2 according to the second embodiment, the first to third gate-all-around devices 101 to 103 may be formed at the same or different levels. In the embodiment shown, the third gate-all-around device 103 is positioned higher than the second gate-all-around device 102, and the second gate-all-around device 102 may be positioned higher than the first gate all around device 101. In detail, the first to third nanowires 119 to 319 may be formed at different levels. In other embodiments, the third nanowire 319 may be formed at a level lower than the second nanowire 219 and/or the first nanowire 119.

Also, the first nanowire 119 may be formed at the same level with the active layer 212, the second nanowire 219 may be formed at the same level with the active layer 312, and the third nanowire 319 may be formed at the same level with another active layer not shown herein. The first nanowire 119 may be formed by patterning the active layer 212, and the second nanowire 219 may be formed by patterning the active layer 312. In this case, a thickness T1 of the first nanowire 119 may be substantially the same with a thickness TS1 of the active layer 212 and a thickness T2 of the second nanowire 219 may be substantially the same with a thickness TS2 of the active layer 312. In other embodiments, T1 may be different from TS1 and/or T2 may be different from TS2.

Also, the thickness T1 of the first nanowire 119, the thickness T2 of the second nanowire 219 and the thickness T3 of the third nanowire 319 may be the same or different from one another. In the embodiment shown, the thickness T1 of the first nanowire 119 is greater than the thickness T2 of the second nanowire 219, and the thickness T2 of the second nanowire 219 is greater than the thickness T3 of the third nanowire 319.

In this arrangement, a first threshold voltage of the first gate-all-around device 101, a second threshold voltage of the second gate-all-around device 102, and a third threshold voltage of the third gate-all-around device 103 may be different from one another. For example, the first gate-all-around device 101 may be a low threshold voltage (Low Vt) transistor, the second gate-all-around device 102 may be a regular threshold voltage (Regular Vt) transistor, and the third gate-all-around device 103 may be a high threshold voltage (High Vt) transistor. In other embodiments, any two or all of the first, second, and third threshold voltages may be the same.

An example of the shape of the third gate-all-around device 103 formed in the third region III will now be described. In this example, the third gate-all-around device 103 includes the sacrificial layer 211, the active layer 212, the sacrificial layer 311, the active layer 312, the insulation layer 313, the third nanowire 319 formed on the insulation layer 313, and the third gate 347 formed on the insulation layer 313 so as to surround the third nanowire 319, which are sequentially formed on the substrate. Because a width of the active layer 312 is greater than a width of the third nanowire 319, the thickness TS2 of the active layer 312 and the thickness T3 of the third nanowire 319 are different from each other.

Figure 5:
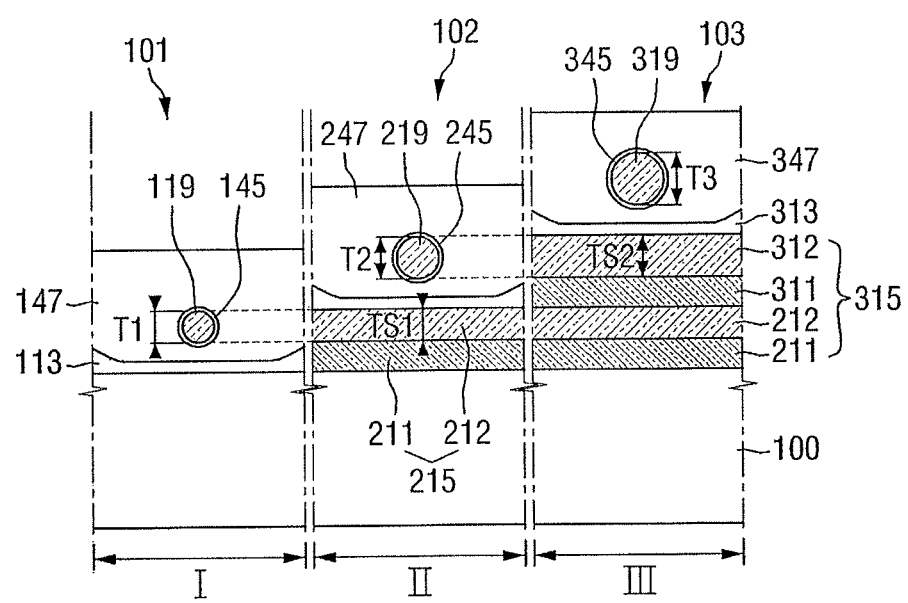
FIG. 5 illustrates a third embodiment of a semiconductor device.

FIG. 5 shows a third embodiment of a semiconductor device. For the sake of convenient explanation, the following description will focus on differences between the current embodiment and the previous embodiment shown in FIGS. 3 and 4.

Referring to FIG. 5, in the semiconductor device 3 according to the third embodiment, a thickness T1 of a first nanowire 119, a thickness T2 of a second nanowire 219, and a thickness T3 of a third nanowire 319 may be different from one another. As shown, the thickness T3 of the third nanowire 319 may be greater than the thickness T2 of the second nanowire 219, and the thickness T2 of the second nanowire 219 may be greater than the thickness T1 of the first nanowire 119.

Accordingly, a first threshold voltage of the first gate all around device 101, a second threshold voltage of the second gate all around device 102, and a third threshold voltage of the third gate all around device 103 may be different from one another. For example, the third gate all around device 103 may be a low threshold voltage (Low Vt) transistor, the second gate all around device 102 may be a regular threshold voltage (Regular Vt) transistor, and the first gate all around device 101 may be a high threshold voltage (High Vt) transistor, but aspects of the present embodiments are not limited thereto.

Figure 6:
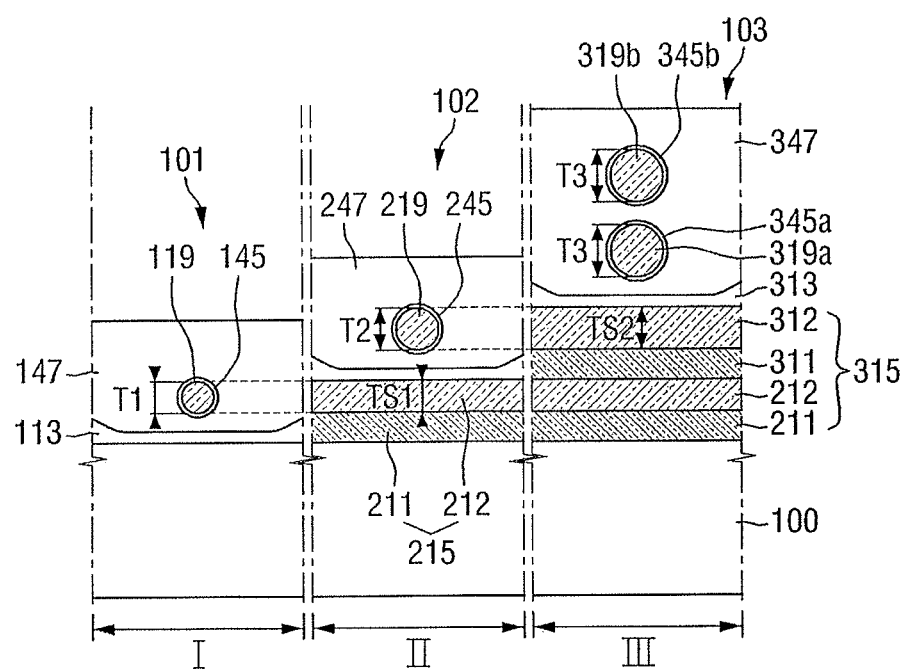
FIG. 6 illustrates a fourth embodiment of a semiconductor device.

FIG. 6 shows a fourth embodiment of a semiconductor device. For the sake of convenient explanation, the following description will focus on differences between the current embodiment and the previous embodiment shown in FIGS. 3 to 5.

Referring to FIG. 6, in the semiconductor device 4 according to the fourth embodiment, a third gate-all-around device 103 may include a plurality of third nanowires 319a and 319b stacked one on another. The plurality of third gate insulation layers 345a and 345b may be formed to surround third nanowires 319a and 319b, respectively. The third gate 347 may be formed to surround the stacked plurality of third nanowires 319a and 319b and may apply the same signal to the plurality of third nanowires 319a and 319b.

As described above, because the third gate-all-around device 103 employs a stacked plurality of third nanowires 319a and 319b, current driving capability can be increased. The stacked plurality of third nanowires 319a and 319b may have the same or different thicknesses T3. Also, while two nanowires as shown in region 3, three or more third nanowires 319a and 319b may be stacked in region III in other embodiments.

Also, in at least one embodiment, the first gate-all-around device 101 may include multiple first nanowires stacked one on the other, and/or the second gate-all-around device 102 may include second nanowires stacked one on the other.

Figure 7:
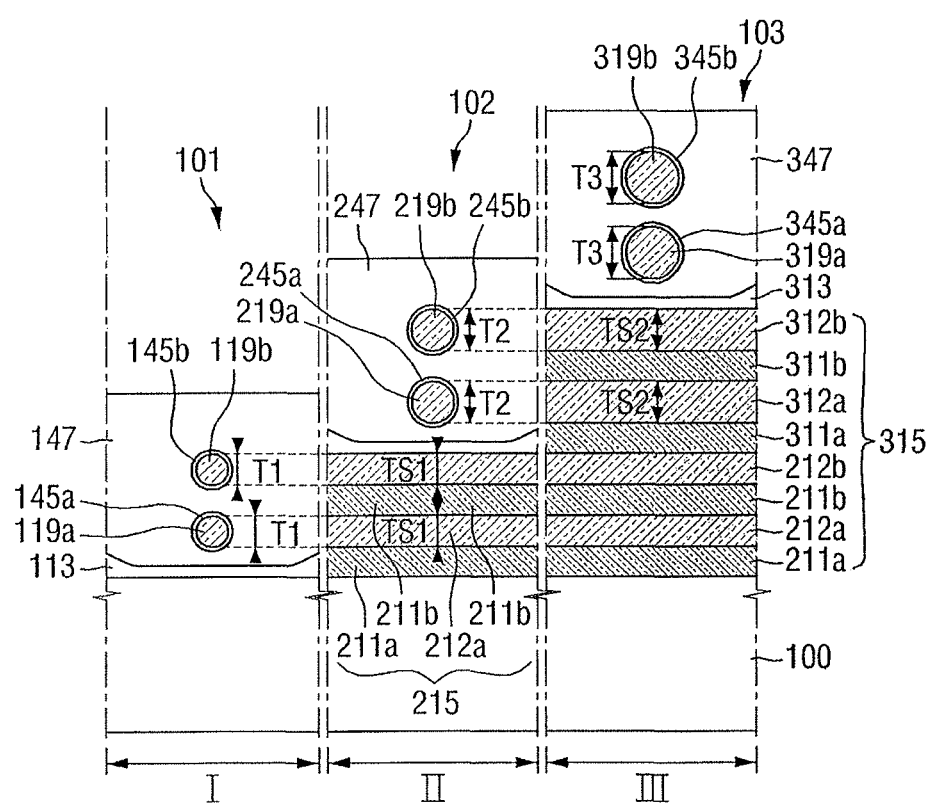
FIG. 7 illustrates a fifth embodiment of a semiconductor device.

FIG. 7 shows a fifth embodiment of a semiconductor device. For the sake of convenient explanation, the following description will focus on differences between the current embodiment and the previous embodiment shown in FIG. 6.

Referring to FIG. 7, in the semiconductor device 5 according to the fifth embodiment, the first, second, and third gate-all-around devices 101, 102, and 103 have a plurality of first nanowires, e.g., device 101 has nanowires 119a and 119b stacked one on another, device 102 has nanowires 219a and 219b stacked on one another, and device 103 has nanowires 319a and 319b stacked on one another.

In this arrangement, a first gate 147 may be formed to surround the stacked plurality of first nanowires 119a and 119b and may apply the same signal to the plurality of first nanowires 119a and 119b. Also, a second gate 247 may be formed to surround the stacked plurality of second nanowires 219a and 219b and may apply the same signal to the plurality of second nanowires 219a and 219b.

Because the first gate-all-around device 101 and the second gate-all-around device 102 employ stacked pluralities of first nanowires 119a and 119b and 219a and 219b, current driving capability can be increased.

The stacked first nanowires 119a and 119b and the stacked second nanowires 219a and 219b may be formed using structures 215 and 315 in which sacrificial layers 211a, 211b, 311a, and 311b and active layers 212a, 212b, 312a, and 312b are alternately stacked. As shown, numbers of the stacked sacrificial layers 211a, 211b, 311a, and 311b and the stacked active layers 212a, 212b, 312a, and 312b may increase according to the numbers of the stacked first nanowires 119a and 119b and the second nanowires 219a and 219b.

In the shown embodiment, a thickness T1 of each of the first nanowires 119a and 119b may be substantially the same with a thickness TS1 of each of the active layers 212a and 212b. A thickness T2 of each of the second nanowires 219a and 219b may be substantially the same with a thickness TS2 of each of the active layers 312a and 312b. Also, the stacked plurality of first nanowires 119a and 119b may have the same or different thicknesses T1. In addition, the stacked plurality of second nanowires 219a and 219b may have the same or different thicknesses T2.

For example, the first gate all around device 101 may include n stacked first nanowires 119a and 119b, where n is a natural number, and the second gate all around device 102 may include m stacked second nanowires 219a and 219b, where m is a natural number. The n first nanowires 119a and 119b may be formed at the same or different levels with the n active layer 212a and 212b, and the m second nanowires 219a and 219b may be formed at the same or different levels with the m active layers 312a and 312b. Here, then active layer 212a and 212b and them active layers 312a and 312b may be different from one another. None of the n active layer 212a and 212b and the m active layers 312a and 312b may overlap with each other.

Figure 8:
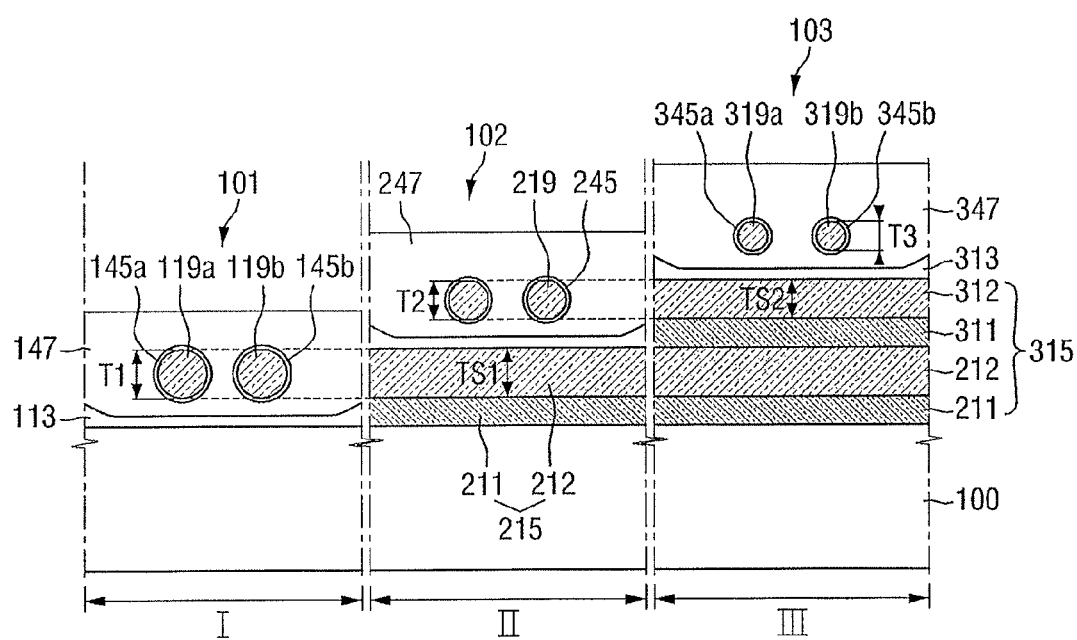
FIG. 8 illustrates a sixth embodiment of a semiconductor device.

FIG. 8 shows a sixth embodiment of a semiconductor device. For the sake of convenient explanation, the following description will focus on differences between the current embodiment and the previous embodiment shown in FIG. 7.

Referring to FIG. 8, in the semiconductor device 6 according to the sixth embodiment, a first gate-all-around device 101 may include first nanowires 119a and 119b horizontally arranged, a second gate-all-around device 102 may include second nanowires 219a and 219b horizontally arranged, and a third gate-all-around device 103 may include third nanowires 319a and 319b horizontally arranged.

Because the first gate all around device 101, the second gate-all-around device 102 and the third gate-all-around device 103 employ a plurality of first nanowires 119a and 119b, a plurality of second nanowires 219a and 219b, and a plurality of third nanowires 319a and 319b, current driving capability can be increased. Because the horizontally arranged plurality of nanowires 119a, 119b, 219a, 219b, 319a, and 319b are provided, the semiconductor device 6 may have an increased size.

Figure 9:
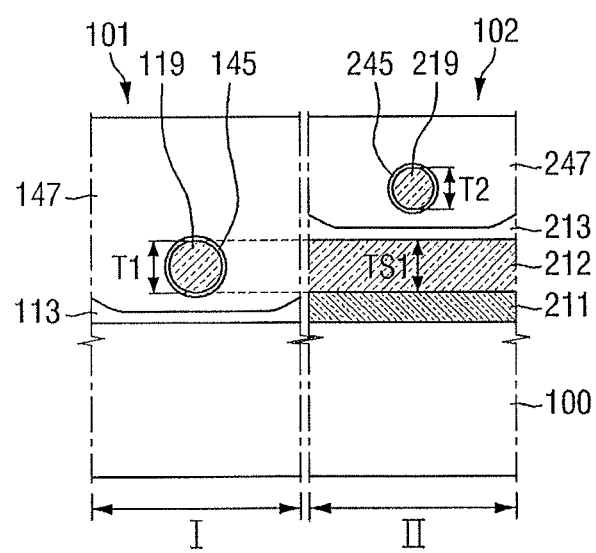
FIG. 9 illustrates a seventh embodiment of a semiconductor device.

FIG. 9 shows a seventh embodiment of a semiconductor device. For the sake of convenient explanation, the following description will focus on differences between the current embodiment and the previous embodiment shown in FIGS. 1 and 2.

Referring to FIG. 9, in the semiconductor device 7 according to the seventh embodiment, a top surface of a first gate 147 of a first gate-all-around device 101 may be substantially parallel with a top surface of a second gate 247 of a second gate-all-around device 102. A conductive layer is formed to sufficiently cover a first region I and a second region II, planarized and patterned, thereby forming a first gate 147 and a second gate 247. In this case, the top surface of the first gate 147 and the top surface of the second gate 247 may be substantially parallel with each other.

Figure 10:
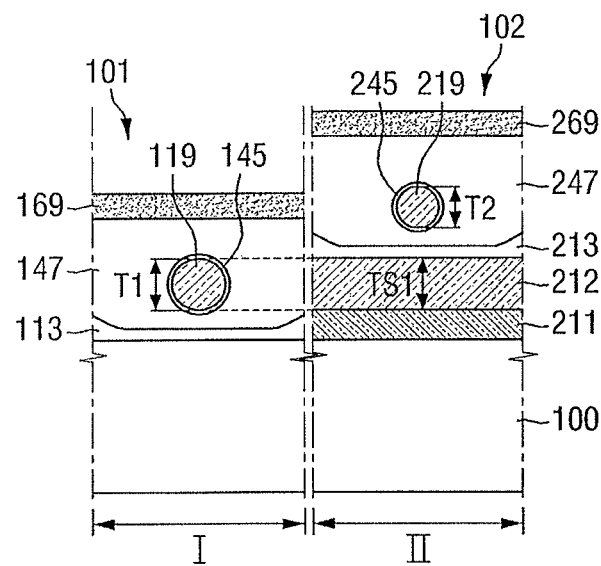
FIG. 10 illustrates an eighth embodiment of a semiconductor device.

FIG. 10 shows an eighth embodiment of a semiconductor device. For the sake of convenient explanation, the following description will focus on differences between the current embodiment and the previous embodiment shown in FIGS. 1 and 2.

Referring to FIG. 10, in the semiconductor device 8 according to the eighth embodiment, stress layers 169 and 269 may be formed on a first gate-all-around device 101 and a second gate-all-around device 102, respectively. The stress layers 169 and 269 may be, for example, SiN layers.

The stress layers 169 and 269 may apply tensile stress or compressive stress based on, for example, a bonding ratio. For example, if the stress layers are SiN layers, these layers may provide tensile or compressive stress based on the N—H to Si—H bonding ratio in the SiN layers. In one embodiment, if the N—H bonding/Si—H bonding ratio is in a range of 1 to 5, each SiN layer offers tensile stress. And, if the N—H bonding/Si—H bonding ratio is in a range of 5 to 20, each SiN layer offers compressive stress. Current amounts of the first gate-all-around device 101 and the second gate-all-around device 102 can be adjusted by adjusting the stress using the stress layers 169 and 269.

As a result, in the semiconductor device 8 according to the eighth embodiment, multiple threshold voltages can be realized by adjusting thicknesses of the nanowires 119 and 219. In addition, because the gate-all-around devices 101 and 102 having the multiple threshold voltages are horizontally separated from each other, rather than being stacked, the stress technology may be easily implemented.

Figure 11:
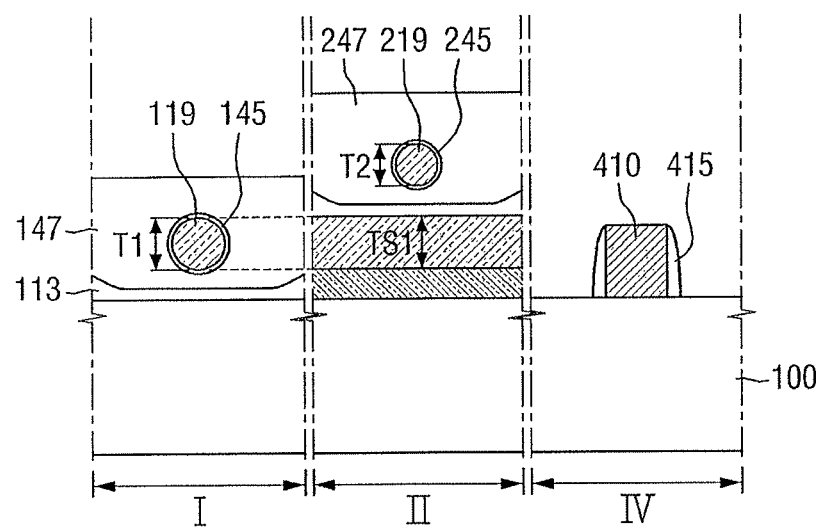
FIG. 11 illustrates a ninth embodiment of a semiconductor device.

FIG. 11 shows a ninth embodiment of a semiconductor device. For the sake of convenient explanation, the following description will focus on differences between the current embodiment and the previous embodiment shown in FIGS. 1 and 2.

Referring to FIG. 11, in the semiconductor device 9 according to the ninth embodiment, a substrate 100 further includes a fourth region IV. Here, a semiconductor device having a structure other than a gate-all-around structure I may be formed on the fourth region IV. For example, in FIG. 11, a planar transistor is formed on the fourth region IV. The planar transistor may include a gate 410 and a spacer 415.

In the semiconductor device 9 according to the ninth embodiment, a bulk wafer is positioned under a structure 215. Therefore, a general device fabrication process can be easily applied to regions other than a first region I or a second region II having the structure 215.

Figure 12:
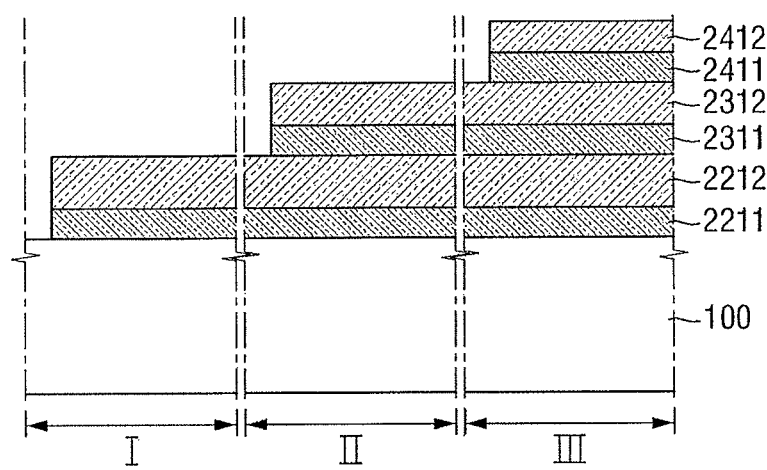
FIGS. 12 to 16 illustrate operations included in one embodiment of a method of making the second embodiment of the semiconductor device.

FIGS. 12 to 16 show operations included in an embodiment of a method for making a semiconductor device according to the second embodiment discussed above. Referring to FIG. 12, the method includes defining first to third regions I to III on a substrate 100, where the first to third regions I to III are separated from one another. Next, a plurality of sacrificial layers 2211, 2311, and 2411 and a plurality of active layers 2212, 2312, and 2412 are alternately stacked on the substrate 100.

The active layers 2212, 2312, and 2412 may be made of, for example, one or more semiconductor materials selected from the group consisting of Si, Ge, SiGe, GaP, GaAs, SiC, SiGeC, InAs, and InP. The sacrificial layers 2211, 2311 and 2411, may be made of different materials from the active layers 2212, 2312, and 2412.

In addition, the sacrificial layers 2211, 2311, and 2411 may have higher etching selectivity than the active layers 2212, 2312, and 2412. For example, the active layers 2212, 2312, and 2412 may include Si, and the sacrificial layers 2211, 2311, and 2411 may include SiGe. In addition, the active layer 212/sacrificial layer 211 may be, for example, at least one selected from the group consisting of Ge/GaAs, Ge/InGaAs, Ge/GeSn, AlGaAs/GaAs, AlGaAs/InGaP, GaN/InN, and AlN/InN. In addition, when the active layer 212 is formed by an epitaxial lateral overgrowth (ELO) method, the sacrificial layer 211 may be an insulation layer made of, for example, SiO2, SiON, or SiN.

Next, the plurality of sacrificial layers 2211, 2311, and 2411 and the plurality of active layers 2212, 2312, and 2412 may be configured to have a stepped shape by patterning the plurality of sacrificial layers 2211, 2311, and 2411 and the plurality of active layers 2212, 2312, and 2412. The sacrificial layer 2211 and the active layer 2212 may be disposed on the first region I, the sacrificial layers 2211 and 2311 and the active layers 2212 and 2312 may be disposed on the second region II, and the sacrificial layers 2211, 2311, and 2411, active layers 2212, 2312, and 2412 may be disposed on the third region III.

Figure 13:
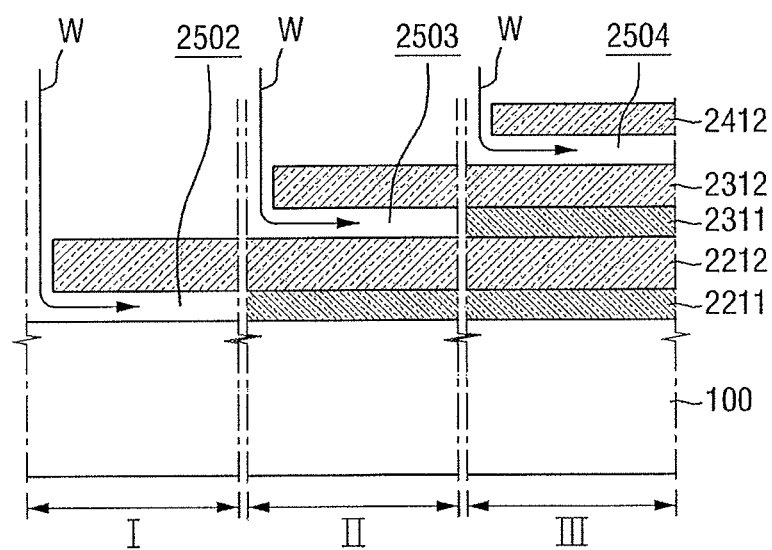

Referring to FIG. 13, some of the one or more sacrificial layers 2211, 2311, and 2411 are selectively removed. As the result, removed regions 2502, 2503, and 2504 are formed on the first region I, second region II, and the third region III, respectively. Selective removal of some of the one or more sacrificial layers 2211, 2311 and 2411 may be performed using a chemical dry etching method (W). For example, when the active layers 2212, 2312, and 2412 are made of Si and the sacrificial layers 2211, 2311, and 2411 are made of SiGe, the processing conditions may include 350 mTorr in pressure, room temperate in temperature, 700 W in microwave power, and 80 sccm of CF4 gas, 12 sccm of O2 gas, and 12 sccm of N2 gas in processing gas, and so on. Under the processing condition stated above, when the active layers 2212, 2312, and 2412 are etched at a rate of 5 Angstroms per second, the sacrificial layers 2211, 2311, and 2411 may be etched at a rate of 200 Angstroms per second.

Figure 14:
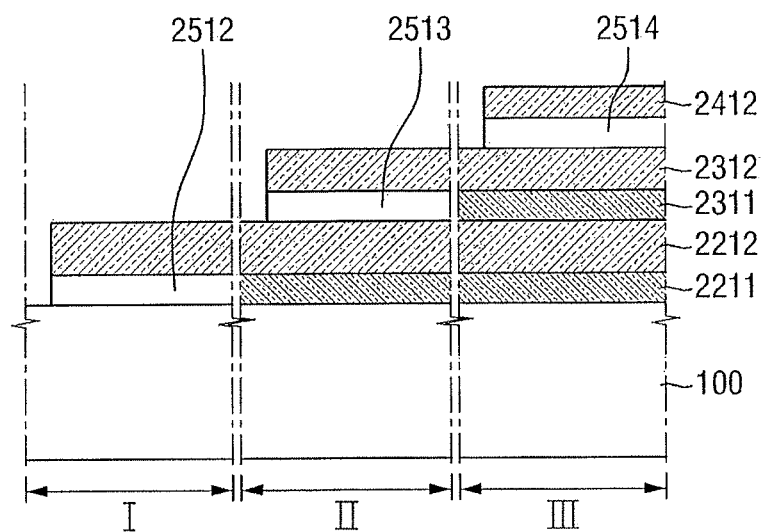

Referring to FIG. 14, a plurality of insulation layers 2512, 2513, and 2514 are formed in the removed regions 2502, 2503 and 2504, respectively. The insulation layers 2512, 2513, and 2514 may be made of at least one of oxide, nitride, oxynitride, or a high-k material.

Figure 15:
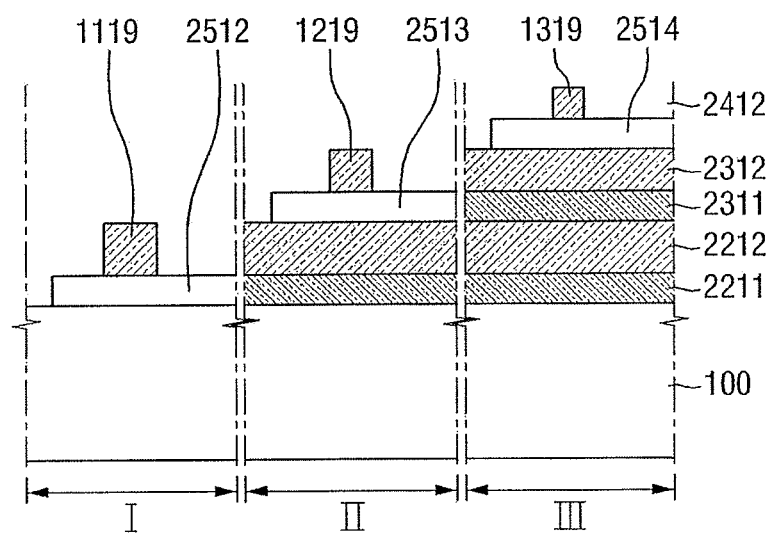

Referring to FIG. 15, some of the one or more active layers 2212, 2312, and 2412 are patterned using the plurality of insulation layers 2512, 2513, and 2514. As the result, active patterns 1119, 1219, and 1319 may be formed on the plurality of insulation layers 2512, 2513, and 2514.

Figure 16:
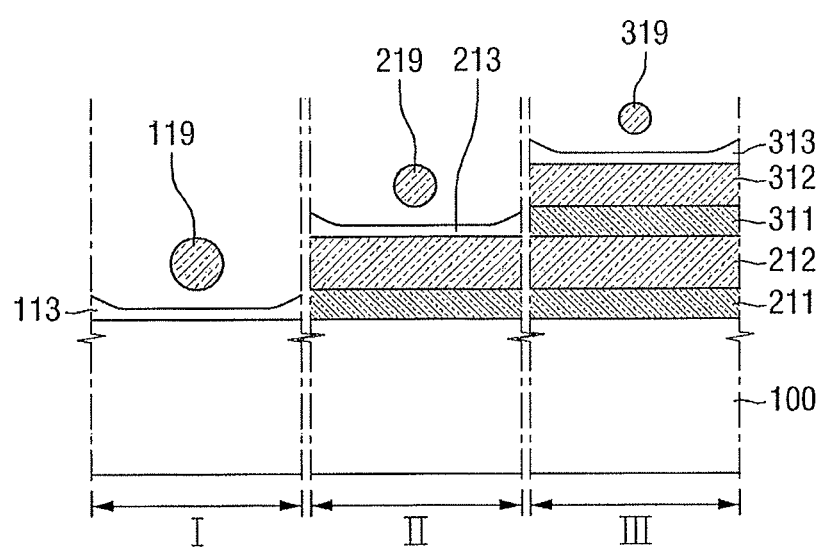

Referring to FIG. 16, the insulation layers 2512, 2513, and 2514 around the one or more active patterns 1119, 1219, and 1319 are removed. For example, the resultant product show in FIG. 15 is trimmed. The trimming may be, for example, wet etching or cleaning. Since the active patterns 1119, 1219, and 1319 have small widths, an etching solution or a cleaning solution may penetrate into lower portions of the active patterns 1119, 1219, and 1319. As the result, the insulation layers 2512, 2513, and 2514 positioned at the lower portions of the active patterns 1119, 1219, and 1319 can be removed. In addition, the active patterns 1119, 1219, and 1319 may be partially etched by the etching solution or the cleaning solution to turn into nanowires 119, 219, and 319.

Referring again to FIGS. 3 and 4, gate insulation layers 145, 245, and 345 and gates 147, 247 and 347 are formed to surround the nanowires 119, 219, and 319. As the result, the first gate-all-around device 101, the second gate all around device 102 and the third gate all around device 103 are completed.

Figure 17A:
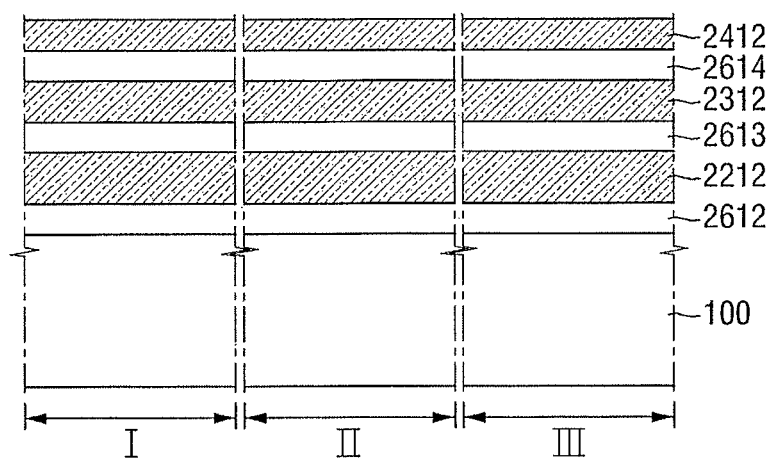
FIGS. 17A to 17D illustrate operations included in one embodiment of a method of making the second embodiment of semiconductor device.
Figure 17B:
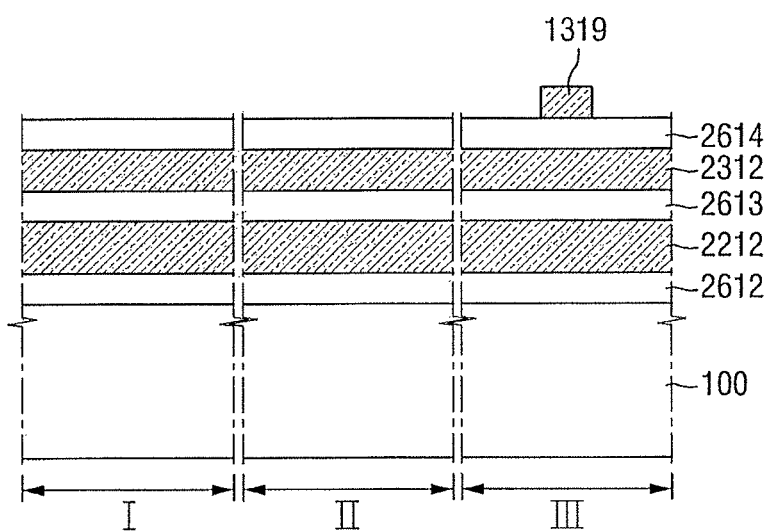

FIGS. 17A to 17D show operations included in another embodiment of a method of making the semiconductor device according to the second embodiment discussed above. Referring to FIG. 17A, the substrate 100 has first to third regions I to III defined thereon, the first to third regions I to III separated from one another.

Next, a plurality of insulation layers 2612, 2613, and 2614 and a plurality of active layers 2212, 2312, and 2412 are alternately stacked on the substrate 100. The active layers 2212, 2312, and 2412 may be made of, for example, one or more semiconductor materials selected from the group consisting of Si, Ge, SiGe, GaP, GaAs, SiC, SiGeC, InAs, and InP. The plurality of insulation layers 2612, 2613, and 2614 may be made of, for example, SiO2, SiON, or SiN.

The forming of the active layers 2212, 2312, and 2412 on the insulation layers 2612, 2613, and 2614 may be performed using for example, an epitaxial lateral overgrowth (ELO) method.

Figure 17C:
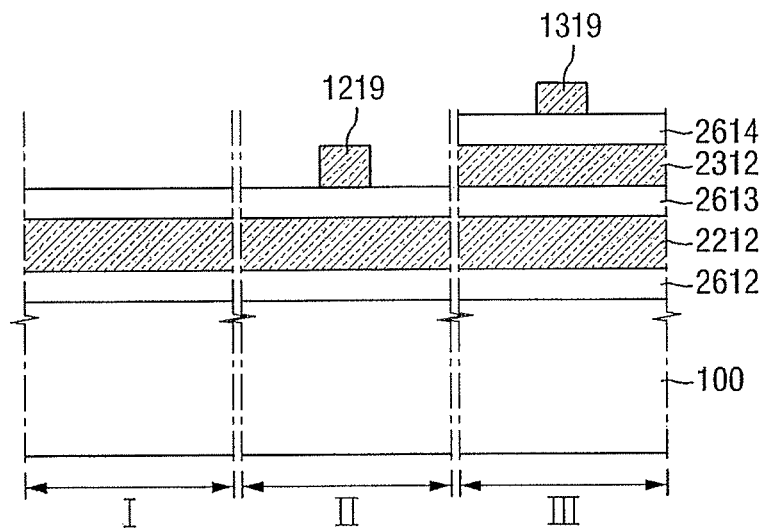
Figure 17D:
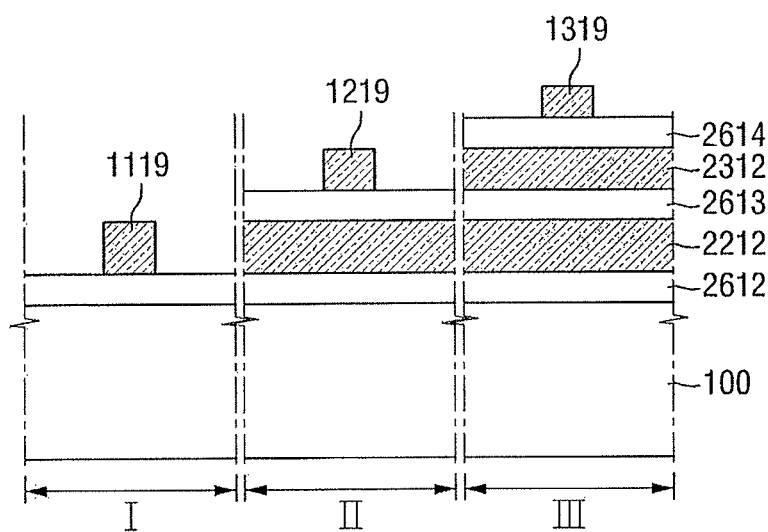

Next, the plurality of plurality of plurality of active layers 2212, 2312, and 2412 are etched to different depths on the first to third regions I to III, thereby forming the first to third active patterns 1119 to 1319 on the first to third regions I to III. More specifically, referring to FIG. 17B, the active pattern 1319 is formed on the third region III by patterning the top active layer 2412. Referring to FIG. 17C, the active pattern 1219 is formed on the second region II by patterning the next top active layer 2312. Referring to FIG. 17D, the active pattern 1119 is formed on the first region I by patterning the bottom active layer 2212.

Referring to FIG. 16, the resultant product show in FIG. 15 is trimmed. The trimming may be, for example, wet etching or cleaning. The active patterns 1119, 1219, and 1319 may be partially etched by an etching solution or a cleaning solution to turn into nanowires 119, 219, and 319.

As described above, the plurality of insulation layers 2612, 2613, and 2614 and the plurality of active layers 2212, 2312, and 2412 are alternately stacked. Then, in order to achieve a threshold voltage (Vt) as required, the active layers 2212, 2312, and 2412 are appropriately etched, thereby forming the nanowires 119, 219, and 319.

Figure 18:
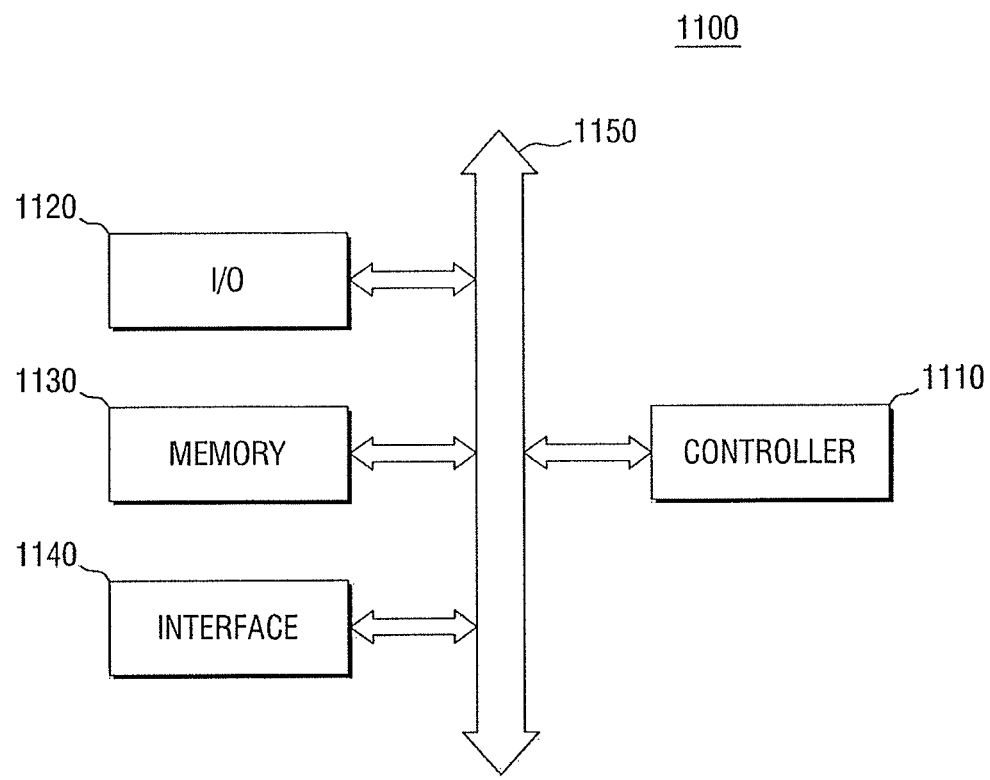
FIG. 18 illustrates one embodiment of an electronic system that may include one or more of the aforementioned embodiments of the semiconductor device.

FIG. 18 shows an embodiment of an electronic system that includes semiconductor devices according to one or more of the embodiments described herein.

Referring to FIG. 18, the electronic system 1100 includes a controller 1110, an input/output device (I/O) 1120, a memory 1130, an interface 1140 and a bus 1150. The controller 1110, the I/O 1120, the memory 1130 and/or the interface 1140 may be connected to each other through the bus 1150. The bus 1150 may corresponds to a path through which data moves.

The controller 1110 may include at least one of a microprocessor, a digital signal processor, a microcontroller, and logic devices capable of performing similar functions to those performed by these devices. The I/O 1120 may include, for example, a keypad, a keyboard, and/or a display device. The memory 1130 may store data and/or instructions. The interface 1140 may transmit/receive data to/from a communication network. The interface 1140 may be wired or wireless. For example, the interface 1140 may include an antenna or a wired/wireless transceiver.

Although not shown, the electronic system 1100 may further include a high-speed DRAM and/or SRAM as an operating memory for improving the operation of the controller 1110. FIN field effect transistors devices according to embodiments of the present inventive concept may be incorporated into the memory 1130 or may be provided as part of the controller 1110, or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 19A:
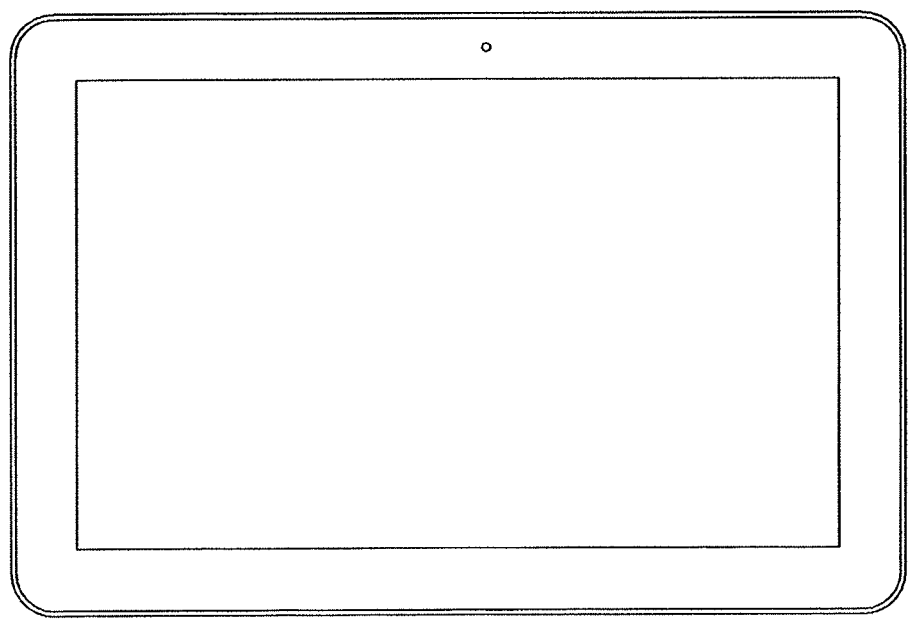
FIGS. 19A and 19B illustrate embodiments of semiconductor systems which may include or otherwise be used with one or more of the aforementioned embodiments of the semiconductor device.
Figure 19B:
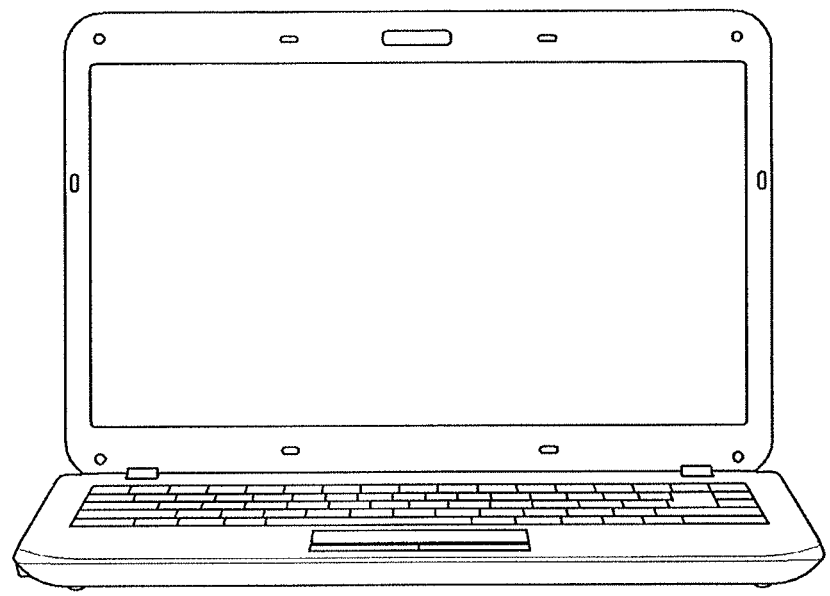

FIGS. 19A and 19B show other semiconductor systems which may include semiconductor devices according to the embodiments described herein. In FIG. 19A, the system is a tablet PC, and, in FIG. 19B, the system is a notebook computer. Examples of other systems include a personal digital assistance, a pad- or pod-type device, a smart phone, a navigation device, and a portable media player, as well as other types of information or electronic terminals.

In the foregoing embodiments, gate-all-around devices have been described as being coupled to nanowires. However, these gate-all-around devices may extend completely round corresponding ones of the nanowires, or in some embodiments one or more of the gate-all-around devices may not completely circumscribe the nanowires.

By way of summation and review, a semiconductor device may be formed to have a plurality of gate-all-around devices located in a respective number of regions on a substrate. Each region may have one or more nanowires at a level which corresponds to an active layer in an adjacent region. As a result, the nanowires may be disposed at different levels. Also, the gate-all-around device in any one region may have a different gate threshold voltage from the gate-all-around device in an adjacent region based, for example, on differences in the thicknesses of the active layers and/or nanowires in those regions. Also, because the nanowires in one region is at a different level than a nanowire in another region, a reduction in parasitic capacitance may realized, while simultaneously achieving improved current control.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
    a structure on a substrate, the structure including a plurality of sacrificial layers and a plurality of active layers alternately stacked on one another, the sacrificial layers having different widths or the active layers having different widths so as to form multiple stepped layers on the substrate; and
    a plurality of gate-all-around devices on the structure, wherein the plurality of gate-all-around devices are disposed on respective ones of the multiple stepped layers.

2. The semiconductor device of claim 1, wherein the plurality of gate-all-around devices have a plurality of nanowires of different thicknesses.

3. The semiconductor device of claim 1, wherein each of the plurality gate-all-around devices has a different threshold voltage.

4. The semiconductor device of claim 1, wherein:
    the sacrificial layers have different widths, and
    the active layers have different widths.

* * * * *